(12) United States Patent
Toshima et al.

(10) Patent No.: US 11,031,306 B2
(45) Date of Patent: Jun. 8, 2021

(54) QUALITY CONTROL METHOD OF POSITION MEASUREMENT LIGHT SOURCE, SEMICONDUCTOR MANUFACTURING APPARATUS, AND METHOD FOR MANUFACTURING SEMICONDUCTOR DEVICE

(71) Applicant: Toshiba Memory Corporation, Tokyo (JP)

(72) Inventors: Miki Toshima, Kanagawa (JP); Sadatoshi Murakami, Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 300 days.

(21) Appl. No.: 16/127,426

(22) Filed: Sep. 11, 2018

(65) Prior Publication Data
US 2019/0295902 A1     Sep. 26, 2019

(30) Foreign Application Priority Data
Mar. 22, 2018  (JP) .............................. JP2018-054409

(51) Int. Cl.
*H01L 21/66*     (2006.01)
*H01L 23/544*    (2006.01)
*H01L 21/027*    (2006.01)
*G01J 3/28*      (2006.01)

(52) U.S. Cl.
CPC ................ *H01L 22/12* (2013.01); *G01J 3/28* (2013.01); *H01L 21/027* (2013.01); *H01L 23/544* (2013.01); *H01L 2223/54426* (2013.01)

(58) Field of Classification Search
CPC ....................................................... H01L 21/66
See application file for complete search history.

(56) References Cited

U.S. PATENT DOCUMENTS 6,862,079 B2    3/2005  Sato
7,719,677 B2    5/2010  Rosengaus

FOREIGN PATENT DOCUMENTS

| JP | 2002-122483 A | 4/2002 |
| JP | 3736796 B2 | 1/2006 |
| JP | 4154144 B2 | 9/2008 |
| JP | 2011-108691 A | 6/2011 |
| JP | 5199539 B2 | 5/2013 |

*Primary Examiner* — Marvin Payen
(74) *Attorney, Agent, or Firm* — Finnegan, Henderson, Farabow, Garrett & Dunner, L.L.P

(57) ABSTRACT

According to one embodiment, a quality control method of a position measurement light source includes irradiating light of the position measurement light source on a plurality of marks having different heights and measuring a relationship between the height of the mark and an intensity of light reflected by the mark. The quality control method includes identifying a wavelength of the position measurement light source by comparing measurement data acquired by the measuring to reference data of a relationship between the height of the mark and an intensity of reflected light for each of a plurality of wavelengths.

8 Claims, 6 Drawing Sheets

QUALITY CONTROL METHOD OF POSITION MEASUREMENT LIGHT SOURCE, SEMICONDUCTOR MANUFACTURING APPARATUS, AND METHOD FOR MANUFACTURING SEMICONDUCTOR DEVICE

CROSS-REFERENCE TO RELATED APPLICATION

This application is based upon and claims the benefit of priority from Japanese Patent Application No. 2018-054409, filed on Mar. 22, 2018; the entire contents of which are incorporated herein by reference.

FIELD

Embodiments described herein relate generally to a quality control method of a position measurement light source, a semiconductor manufacturing apparatus, and a method for manufacturing a semiconductor device.

BACKGROUND

For example, a position measurement light source is mounted separately from an exposure light source in a semiconductor exposure apparatus. The alignment shift amount of a pattern in a wafer surface can be measured by using the position measurement light source to read a mark or a pattern formed in the wafer.

DETAILED DESCRIPTION

Figure 1A:
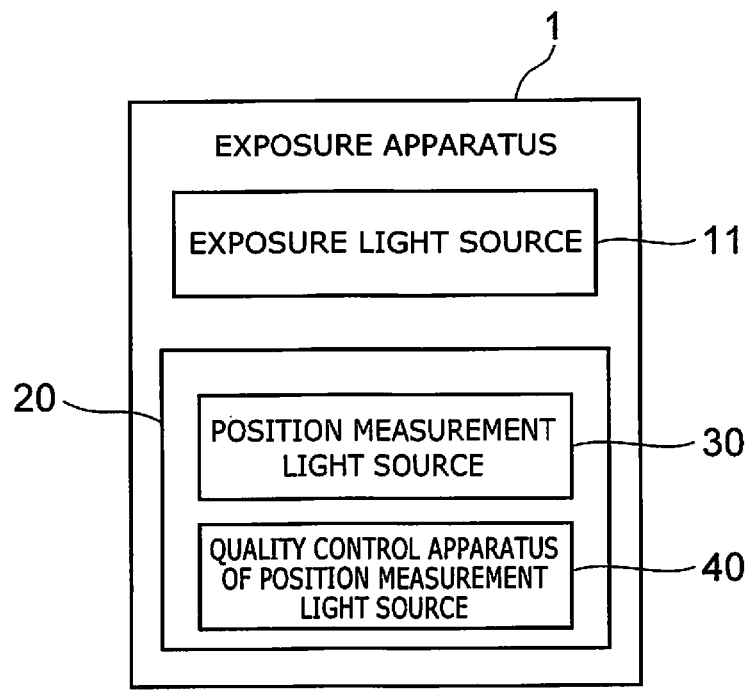
FIG. 1A is a block diagram showing a configuration of a semiconductor exposure apparatus according to an embodiment.

According to one embodiment, a quality control method of a position measurement light source includes irradiating light of the position measurement light source on a plurality of marks having different heights and measuring a relationship between the height of the mark and an intensity of light reflected by the mark. The quality control method includes identifying a wavelength of the position measurement light source by comparing measurement data acquired by the measuring to reference data of a relationship between the height of the mark and an intensity of reflected light for each of a plurality of wavelengths.

An embodiment will now be described with reference to the drawings. The same components in the drawings are marked with the same reference numerals, and a detailed description is omitted as appropriate. The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

FIG. 1A is a block diagram showing the configuration of a semiconductor manufacturing apparatus according to the embodiment. For example, a semiconductor exposure apparatus 1 is illustrated in FIG. 1A.

Figure 2:
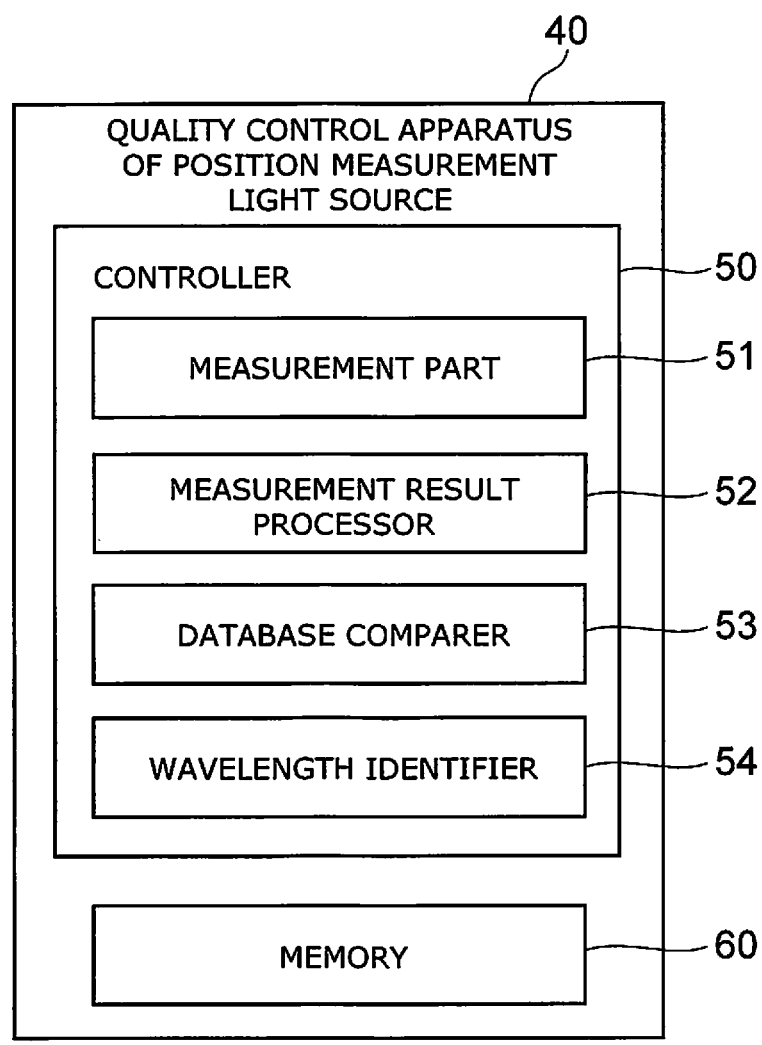
FIG. 2 is a block diagram showing a configuration of a quality control apparatus of a position measurement light source according to the embodiment.

FIG. 2 is a block diagram showing the configuration of a quality control apparatus 40 of a position measurement light source according to the embodiment.

Figure 3:
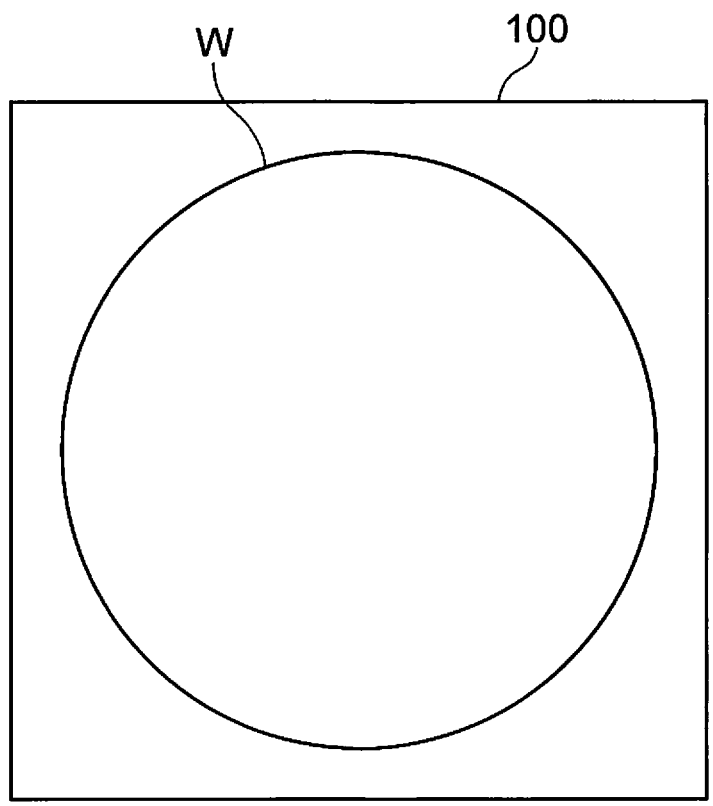
FIG. 3 is a schematic top view of a wafer stage, and a wafer held on the wafer stage.

FIG. 3 is a schematic top view of a wafer stage 100, and a wafer W held on the wafer stage 100.

As shown in FIG. 1A, the semiconductor exposure apparatus 1 according to the embodiment includes an exposure light source 11 and an alignment apparatus 20. The semiconductor exposure apparatus 1 also includes the wafer stage 100 shown in FIG. 3.

The alignment apparatus 20 includes a position measurement light source 30, and the quality control apparatus 40 of the position measurement light source 30.

The exposure light source 11 is a light source for transferring a latent pattern image to the wafer W via a photomask. The position measurement light source 30 is a light source for reading the mark or the foundation pattern for alignment formed in the wafer W and for performing alignment of the wafer W with respect to the photomask, etc.

As shown in FIG. 2, the quality control apparatus 40 of the position measurement light source includes a controller 50 and memory 60. The controller 50 includes a measurement part 51, a measurement result processor 52, a database comparer 53, and a wavelength identifier 54.

A quality control method of the position measurement light source according to the embodiment will now be described with reference to the flowchart of FIG. 4.

Multiple marks that have different heights are formed in the wafer W or the wafer stage 100.

Figure 5:
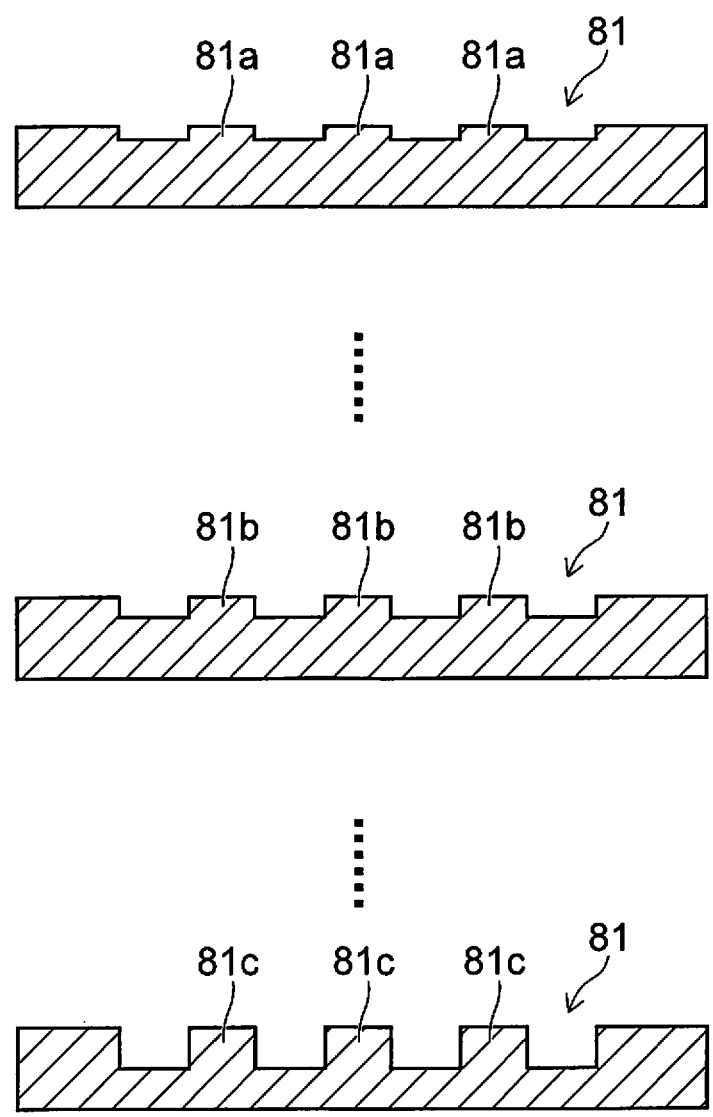
FIG. 5 is a schematic cross-sectional view of marks provided in a wafer stage or a wafer according to the embodiment.

FIG. 5 is a schematic cross-sectional view of marks 81.

The marks 81 are unevenness patterns including multiple protrusions and multiple recesses arranged alternately and periodically. The marks 81 include multiple protrusions 81a, 81b, and 81c having different heights. In the example shown in FIG. 5, the height of the protrusion 81b is higher than the height of the protrusion 81a; and the height of the protrusion 81c is higher than the height of the protrusion 81b.

The heights of the marks 81 refer to the heights of the protrusions 81a, 81b, and 81c. Also, the marks may have structures including unevenness patterns, and films covering the unevenness patterns. In such a case, the heights of the marks may refer to the thicknesses of the films covering the unevenness patterns.

The heights of the marks 81 are different to have not less than three steps and not more than five steps within the range not less than $1/15$ and not more than $1/10$ of the specification wavelength of the position measurement light source 30.

Figure 4:
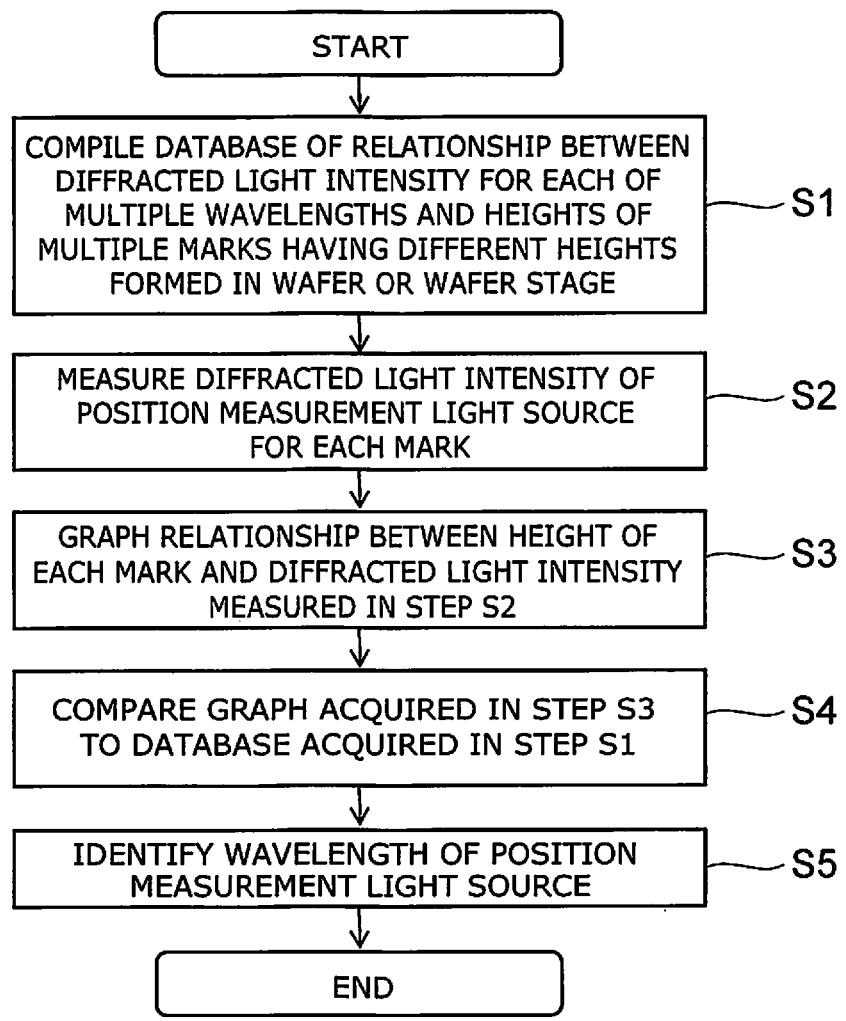
FIG. 4 is a flow chart of a quality control method of a position measurement light source.

In step S1 of FIG. 4, the relationship between the diffracted light intensity for each of multiple wavelengths and the heights of the marks 81 formed in the wafer W or the wafer stage 100 are compiled in a database and stored in the memory 60 as reference data.

Figure 6A:
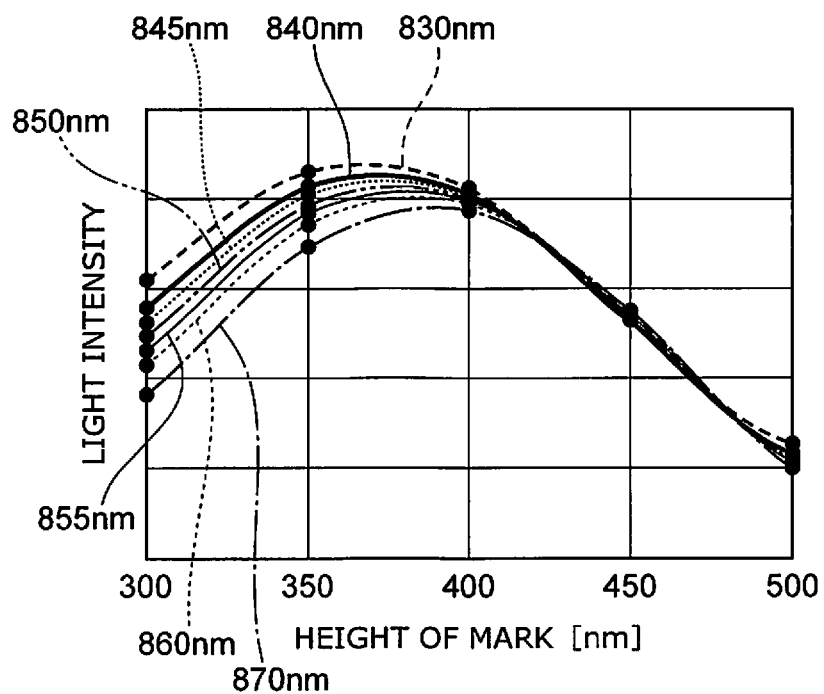
FIG. 6A is a graph illustrating an example of a reference data showing a relationship between a height of the mark and an intensity of reflected light for each of a plurality of wavelengths.

FIG. 6A is a graph illustrating an example of the reference data.

The horizontal axis illustrates the height of the mark. The vertical axis illustrates the intensity of the diffracted light diffracted and reflected by the mark. The diffracted light intensity is determined by a simulation for each of multiple wavelengths, e.g., the seven wavelengths of 830 nm, 840 nm, 845 nm, 850 nm, 855 nm, 860 nm, and 870 nm.

The reference data may be stored not in the memory 60 included in the semiconductor exposure apparatus 1 but in external memory.

In step S2, the light of the position measurement light source 30 is irradiated on each of the marks 81; and the intensity of the diffracted light that is diffracted and reflected by the mark 81 is measured. The measurement is executed by the measurement part 51 shown in FIG. 2.

Then, in step S3, the measurement result processor 52 graphs the relationship between the height of the mark 81 and the intensity of the diffracted light recited above and acquires the relationship as measurement data.

Figure 6B:
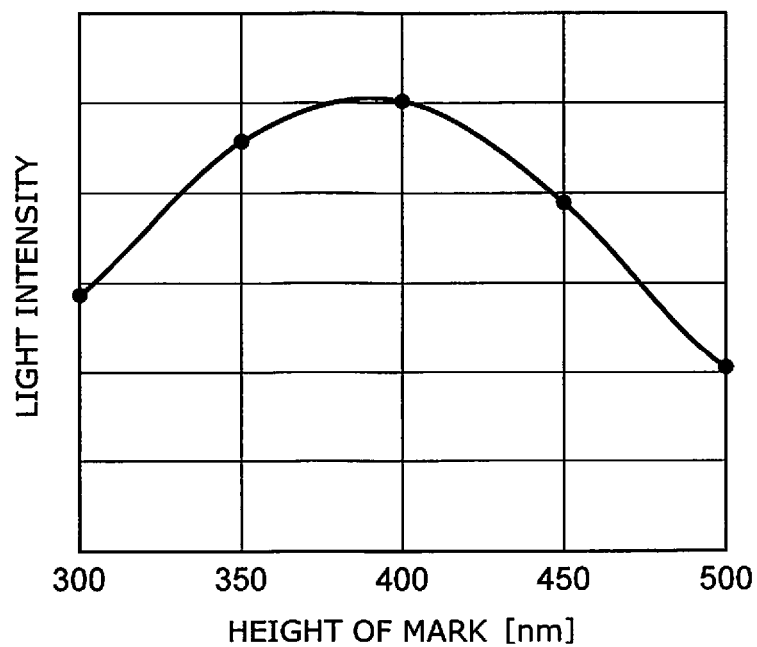
FIG. 6B is a graph illustrating an example of a measurement data showing a relationship between a height of the mark and an intensity of light reflected by the mark of a position measurement light source.

FIG. 6B is a graph illustrating an example of the measurement data.

The horizontal axis illustrates the height of the mark 81. The vertical axis illustrates the intensity of the diffracted light of the position measurement light source 30 diffracted and reflected by the mark 81.

Then, in step S4, the database comparer 53 compares the measurement data (the graph shown in FIG. 6B) to the reference data (the graph shown in FIG. 6A).

In step S5, based on the comparison processing, the wavelength identifier 54 identifies and outputs the wavelength (e.g., the center wavelength) of the position measurement light source 30. For example, data from among the reference data shown in FIG. 6A that matches or approximates the shape and/or the peak wavelength of the graph shown in FIG. 6B is extracted; and the wavelength of the position measurement light source 30 can be identified.

Generally, compared to the exposure light source, etc., there has been a tendency for high quality control to be unnecessary for the position measurement light source mounted in the semiconductor manufacturing apparatus. For example, although it is possible to evaluate the position measurement light source during maintenance of the semiconductor manufacturing apparatus, it is difficult to constantly monitor the characteristics of the position measurement light source after mounting in the apparatus.

Conversely, according to the embodiment of the invention, it is possible to constantly monitor the characteristics of the position measurement light source without downtime of the semiconductor manufacturing apparatus. For example, if it can be determined that the wavelength of the position measurement light source has shifted from the wavelength determined by the specification, the amount of the shift can be fed back; and it is also possible to perform a calibration of the position measurement light source. For example, the temperature characteristic of the position measurement light source 30 is measured in advance. The wavelength of the position measurement light source 30 can be calibrated by controlling the temperature of the position measurement light source 30 according to the measured temperature characteristic.

An error may occur in the measurement of the alignment shift amount using the position measurement light source due to patterning fluctuation of the marks or the patterns formed in the wafer used for alignment. The level of the measurement error of this alignment shift amount fluctuates easily according to the wavelength of the position measurement light source. There are wavelengths for which the measurement error occurs easily, and wavelengths for which the measurement error does not occur easily.

Therefore, by identifying the wavelength of the position measurement light source as in the embodiment, it is possible to cancel the measurement error based on a correlation between the wavelength and the measurement error amount.

Figure 1B:
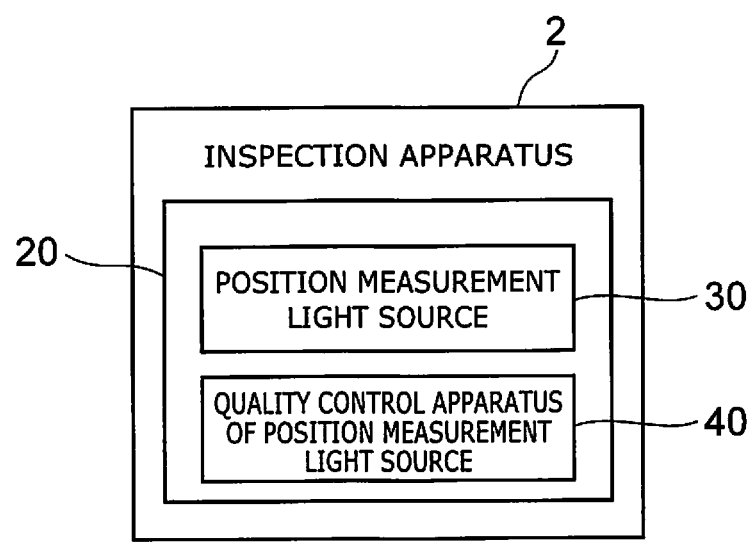
FIG. 1B is a block diagram showing a configuration of an inspection apparatus according to the embodiment.

Although a semiconductor exposure apparatus is illustrated as a semiconductor manufacturing apparatus in the embodiment described above, the semiconductor manufacturing apparatus may be a semiconductor inspection apparatus 2 as shown in FIG. 1B.

Similarly to the semiconductor exposure apparatus 1 described above, the semiconductor inspection apparatus 2 also includes the alignment apparatus 20 which includes the position measurement light source 30 and the quality control apparatus 40 of the position measurement light source 30. Then, the wavelength of the position measurement light source 30 can be identified according to the flow of FIG. 4.

According to one embodiment, a method for manufacturing a semiconductor device, comprising:
exposing a circuit pattern of a semiconductor device to a first wafer using the exposure apparatus 1 including the position measurement light source 30;
calibrating a wavelength of the position measurement light source 30 when the wavelength of the position measurement light source 30 identified by the above method is out of a predetermined range; and
exposing the circuit pattern of the semiconductor device to a second wafer using the exposure apparatus 1 including the position measurement light source 30 having the calibrated wavelength.

According to one embodiment, a method for manufacturing a semiconductor device, comprising:
exposing a first circuit pattern of a semiconductor device to a first wafer using the exposure apparatus 1 including the position measurement light source 30;
calibrating a wavelength of the position measurement light source 30 when the wavelength of the position measurement light source 30 identified by the above method is out of a predetermined range; and
exposing a second circuit pattern of the semiconductor device to the first wafer using the exposure apparatus 1 including the position measurement light source 30 having the calibrated wavelength.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor manufacturing apparatus, comprising:
a position measurement light source; and
a controller irradiating light of the position measurement light source on a plurality of marks having different heights, measuring a relationship between the height of the mark and an intensity of light reflected by the mark, and identifying a wavelength of the position measurement light source by comparing measurement data acquired by the measuring to reference data of a relationship between the height of the mark and an intensity of reflected light for each of a plurality of wavelengths.

2. The apparatus according to claim 1, further comprising memory storing the reference data.

3. The apparatus according to claim 1, further comprising a wafer stage, the plurality of marks being provided in the wafer stage.

4. The apparatus according to claim 3, wherein the heights of the marks are different to have not less than three steps and not more than five steps within a range not less than $\frac{1}{15}$ and not more than $\frac{1}{10}$ of a specification wavelength of the position measurement light source.

5. The apparatus according to claim 3, wherein the mark is an unevenness pattern including a plurality of protrusions and a plurality of recesses arranged alternately and periodically.

6. The apparatus according to claim 5, wherein
the mark includes the unevenness pattern, and a film covering the unevenness pattern, and
the height of the mark is a thickness of the film.

7. The apparatus according to claim 1, further comprising an exposure light source.

8. The apparatus according to claim 1, wherein the controller graphs the relationship between the height of the mark and the intensity of the light reflected by the mark.

* * * * *